United States Patent [19]

Eitan

[11] Patent Number: 5,034,786

[45] Date of Patent: Jul. 23, 1991

[54] OPAQUE COVER FOR PREVENTING ERASURE OF AN EPROM

[75] Inventor: Boaz Eitan, Sunnyvale, Calif.

[73] Assignee: WaferScale Integration, Inc., Fremont, Calif.

[21] Appl. No.: 214,562

[22] Filed: Jul. 1, 1988

Related U.S. Application Data

[63] Continuation-in-part of Ser. No. 902,236, Aug. 29, 1986, Pat. No. 4,758,869.

[51] Int. Cl.$^5$ .................... H01L 29/68; H01L 29/78; H01L 29/92; H01L 27/14
[52] U.S. Cl. .................................. 357/23.5; 357/23.6; 357/23.14; 357/30; 357/47; 357/53; 357/54; 357/84
[58] Field of Search ................. 357/23.5, 54, 84, 23.6, 357/23.14, 30, 47, 53

[56] References Cited

U.S. PATENT DOCUMENTS

| | | | |
|---|---|---|---|
| 3,518,494 | 6/1970 | James | 357/84 |
| 3,573,571 | 4/1971 | Brown et al. | 357/84 |
| 4,258,378 | 3/1981 | Wall | 357/41 |
| 4,267,558 | 5/1981 | Guterman | 357/41 |
| 4,291,326 | 9/1981 | Higuchi et al. | 357/84 |
| 4,302,766 | 11/1981 | Guterman et al. | 357/41 |
| 4,317,273 | 3/1982 | Guterman et al. | 29/571 |
| 4,376,947 | 3/1983 | Chiu et al. | 357/23 |
| 4,376,983 | 3/1983 | Tsaur et al. | 365/53 |
| 4,409,723 | 10/1983 | Harari | 29/571 |
| 4,519,050 | 5/1985 | Folmsbee | 365/53 |
| 4,527,259 | 7/1985 | Watanabe | 365/189 |
| 4,536,941 | 8/1985 | Kuo et al. | 357/84 |
| 4,581,622 | 4/1986 | Takasaki | 357/23.5 |
| 4,590,503 | 5/1986 | Harari et al. | 357/23.14 |
| 4,758,869 | 7/1988 | Eitan et al. | 357/23.5 |
| 4,805,138 | 2/1989 | McElroy et al. | 357/84 |
| 4,825,278 | 4/1989 | Hillenius et al. | 357/84 |

FOREIGN PATENT DOCUMENTS

| | | | |
|---|---|---|---|
| 56-015061 | 2/1981 | Japan | 357/84 |
| 60-004257 | 1/1985 | Japan | 357/84 |
| 60-177685 | 9/1985 | Japan | 357/84 |
| 60-45067 | 11/1985 | Japan | 357/23.5 |
| 61-049475 | 3/1986 | Japan | 357/23.5 |
| 61-258471 | 11/1986 | Japan | 357/84 |
| 63-308388 | 12/1988 | Japan | 357/84 |
| 2074788 | 11/1981 | United Kingdom | 357/23.5 |
| 2097581 | 11/1982 | United Kingdom | 357/23.5 |

OTHER PUBLICATIONS

Folmsbee, "PROM Cell Made with an EPROM Process", International Electron Devices Meeting, 1983, Technical Digest, pp. 574-576.

Spaw et al., "A 128K EPROM with Redundancy" IEEE International Solid-State Circuits Conference Digest of Technical Paper, Feb. 10-12, 1982, pp. 112-113.

Primary Examiner—Andrew J. James
Assistant Examiner—Daniel Y. J. Kim
Attorney, Agent, or Firm—Skjerven, Morrill, MacPherson, Franklin & Friel

[57] ABSTRACT

A structure for preventing light from reaching and erasing a floating gate comprises a control gate which covers not only the floating gate, but the portion of the semiconductor substrate laterally surrounding the floating gate. In accordance with one novel feature of my invention, a conductive structure also laterally surrounds the floating gate and extends between the semiconductor substrate and the control gate. In one embodiment, the conductive structure is electrically shorted to ground and is constructed from the same layer of material as the floating gate. Of importance, the conductive structure both serves as an additional light blocking structure and also serves as a field plate so that it is not necessary to form a thick field oxide layer surrounding the transistor. Because the conductive structure and the control gate are used as the light blocking structure and the contact metallization layer is not used to form the opaque cover, it is possible to extend contact metallization over the covered floating gate transistor.

10 Claims, 5 Drawing Sheets

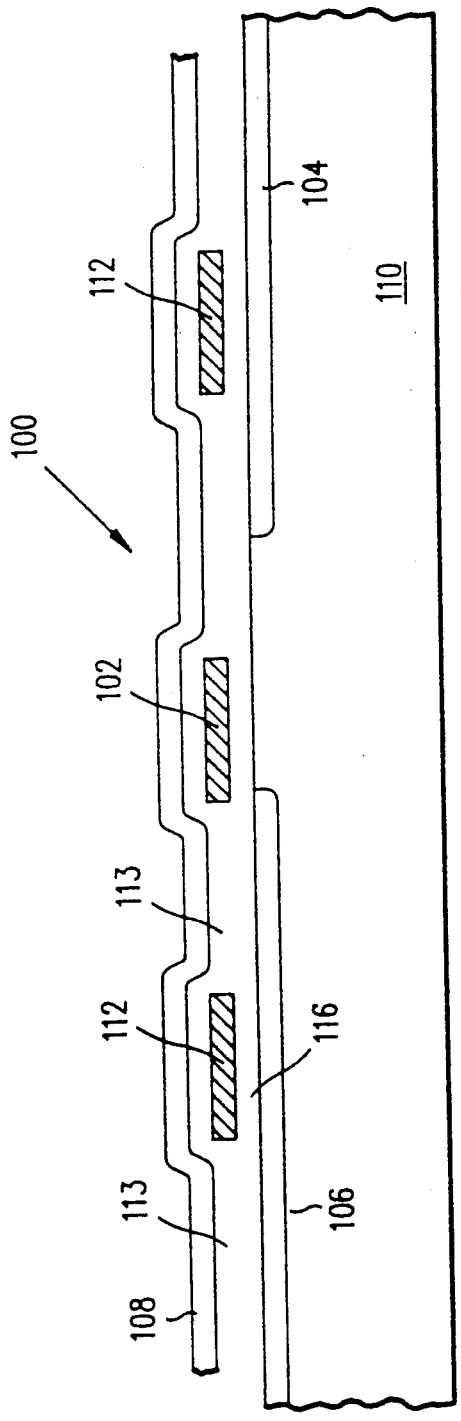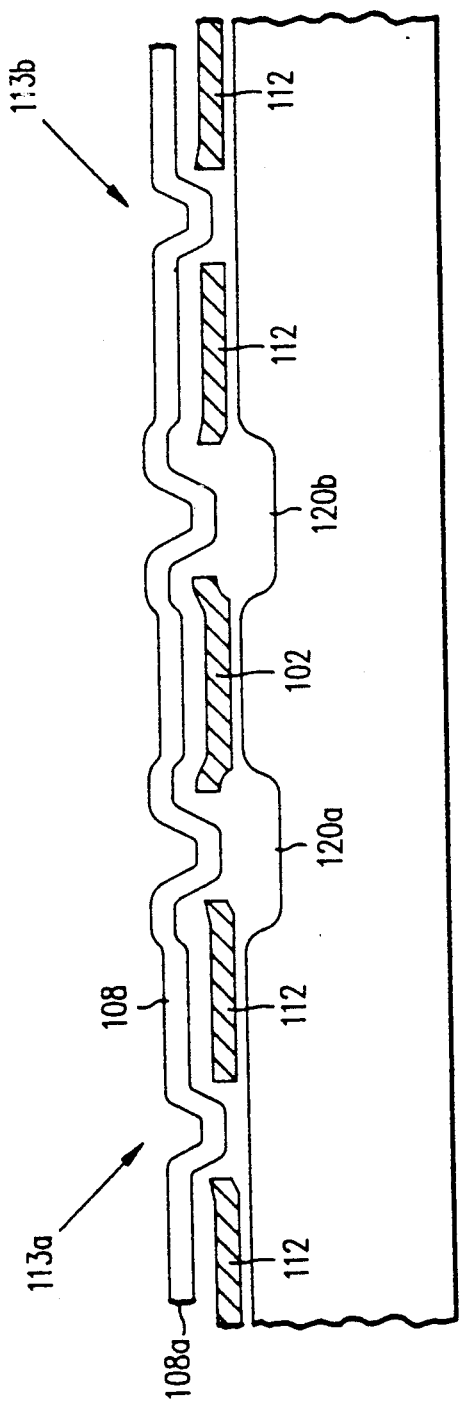

OPAQUE COVER FOR PREVENTING ERASURE OF AN EPROM

This application is a continuation-in-part of copending U.S. Patent Application Serial No. 06/902,236 filed August 29, 1986 by Boaz Eitan and Reza Kazerounian, incorporated herein by reference.

BACKGROUND OF THE INVENTION

1. Field of the Invention

This invention relates to an opaque cover for preventing light from reaching the floating gate of a floating gate transistor.

Floating gate memory devices such as EPROMs are well known in the art. Such devices typically include an array of floating gate transistors for storing data. Unfortunately, some of the transistors within the array are sometimes defective. Accordingly, it is known in the art to manufacture EPROMs using redundant memory cells. Thus, if the EPROM includes a defective memory cell, the defective memory cell is decoupled from the array and a redundant cell is coupled to the array to replace the defective cell.

It is known in the art to provide an extra floating gate transistor in the EPROM to programmably control whether the redundant cells are to be coupled to the array to replace defective cells. Of importance, the extra floating gate transistor can be programmed to couple the redundant cells to the array but an opaque metal cover is formed over the extra transistor to prevent it from being erased when the rest of the EPROM is exposed to UV light. An example of such a structure is discussed in the article entitled "PROM Cell Made With An EPROM Process" by Alan C. Folmsbee, published at the International Electron Devices Meeting in 1983, incorporated herein by reference.

FIG. 1 illustrates in cross-section the Folmsbee structure, in which a metal cover 1 is formed over a floating gate transistor 2. Floating gate transistor 2 comprises a drain 3, a source 4, a floating gate 5 and a control gate 6. A thick oxide layer 9 is formed between floating gate transistor 2 and metal cover 1 to electrically insulate metal cover 1 from floating gate 6, drain 3, and the semiconductor substrate. Metal cover 1 reflects ambient light 7, and thereby prevents the light from reaching floating gate 5. Folmsbee provides an opening 8 in metal cover 1 so that portions of the drain 3 and control gate 6 can extend outside of the metal cover 1 where they can be electrically contacted.

Folmsbee's structure has a number of problems. light can enter through opening 8 in metal cover 1. This light reflects off of silicon substrate 10 and metal cover 1 and is attenuated when it reaches floating gate 5. To ensure that the light is sufficiently attenuated by the time it reaches floating gate 5, it is necessary to either minimize the thickness $T_{OX}$ of oxide layer 9 or increase the distance D between transistor 2 and opening 8. Unfortunately, it is difficult to minimize oxide thickness $T_{OX}$ underneath metal cover 1 because conventional semiconductor processes used to manufacture EPROMs do not typically include a step which allows for the formation of a thin oxide layer between the metallization and the underlying semiconductor substrate. Instead, such processes typically require the formation of a thick oxide layer between the metallization and underlying substrate so that the likelihood of a short circuit between the metallization and the substrate is reduced.

Thus, instead of minimizing thickness $T_{OX}$ of oxide layer 9, Folmsbee uses an oxide thickness of 1.85 microns, and must increase the size of metal cover 1 so that distance D is 80 microns. Therefore, Folmsbee's structure takes up a large surface area and is expensive to build.

Another problem with the structure of FIG. 1 is that most EPROMs are constructed using a single layer of interconnect metallization. By using the metal layer to form cover 1, it is impossible to extend metal interconnects over opaque cover 1 in most EPROM processes. Because metal interconnects cannot be placed over metal cover 1, the surface area of the integrated circuit cannot be used as efficiently as it could if one could pass metal interconnects over the opaque cover.

U.S Pat. No. 4,519,050, issued on May 21, 1985 to Folmsbee, discusses a structure similar to the structure described in the above-cited Folmsbee paper and, thus, suffers from the shortcomings of the structure of FIG. 1.

SUMMARY

A novel structure for preventing light from reaching an EPROM cell transistor comprises first and second conductive layers. The second conductive layer is used to form the transistor control gate and the first conductive layer is used to form the transistor floating gate. Of importance, the control gate extends over an area covering the floating gate and the portion of the semiconductor substrate surrounding the floating gate and thus, the control gate prevents light from reaching the floating gate formed thereunder. In accordance with one novel feature of my invention, an opaque structure formed from the first conductive layer laterally surrounds the floating gate and serves as an additional structure for preventing light from reaching the floating gate. The opaque structure is typically formed between the control gate and the substrate.

In accordance with another embodiment of my invention, a plurality of floating gate transistors use a common control gate which blocks light from reaching each floating gate within the plurality of floating gate transistors. Of importance, an opaque structure formed from the first conductive layer laterally surrounds each floating gate. The opaque structure is conductive and is grounded and serves as a field plate to prevent parasitic channels from electrically connecting the different transistors within the plurality of transistors. Thus, it is not necessary to provide thick field oxide which extends along the entire length of the portion of the transistor structures underneath the control gate in order to separate individual transistors. Because of this, it is more difficult for light to travel underneath the common control gate and the light-blocking efficiency of the structure is enhanced.

Although the opaque field plate prevents parasitic channels from forming between adjacent transistors, in a preferred embodiment, small field oxide regions are provided in the area between the floating gates and the field plate to prevent parasitic channels from forming between the sources and drains independently of the charge of the floating gate.

Another advantage of the structure of the present invention is that it does not use an additional metal layer to serve as the opaque cover for blocking light from reaching the transistor. Therefore, it is possible to extend the contact metallization over the floating gate transistor and, thus, to route metal interconnects more efficiently than was possible in the Folmsbee structure.

During manufacturing, the source and drain regions are formed by ion implantation after deposition and patterning of the first conductive layer. The source and drain regions are extended underneath the field plate by diffusion. By constructing the field plate in this manner, it is not necessary to provide breaks in the field plate where the source and drain are to extend. Since the field plate impedes light from reaching the floating gate, the absence of breaks in the field plate enhances its ability to block light.

These and other advantages of the present invention are better understood with reference to the detailed description below.

BRIEF DESCRIPTION OF THE DRAWINGS

FIGS. 3a and 3b illustrate in cross-section the EPROM cell transistor of FIG. 2 along lines AA and BB, respectively.

DETAILED DESCRIPTION

Figure 2:
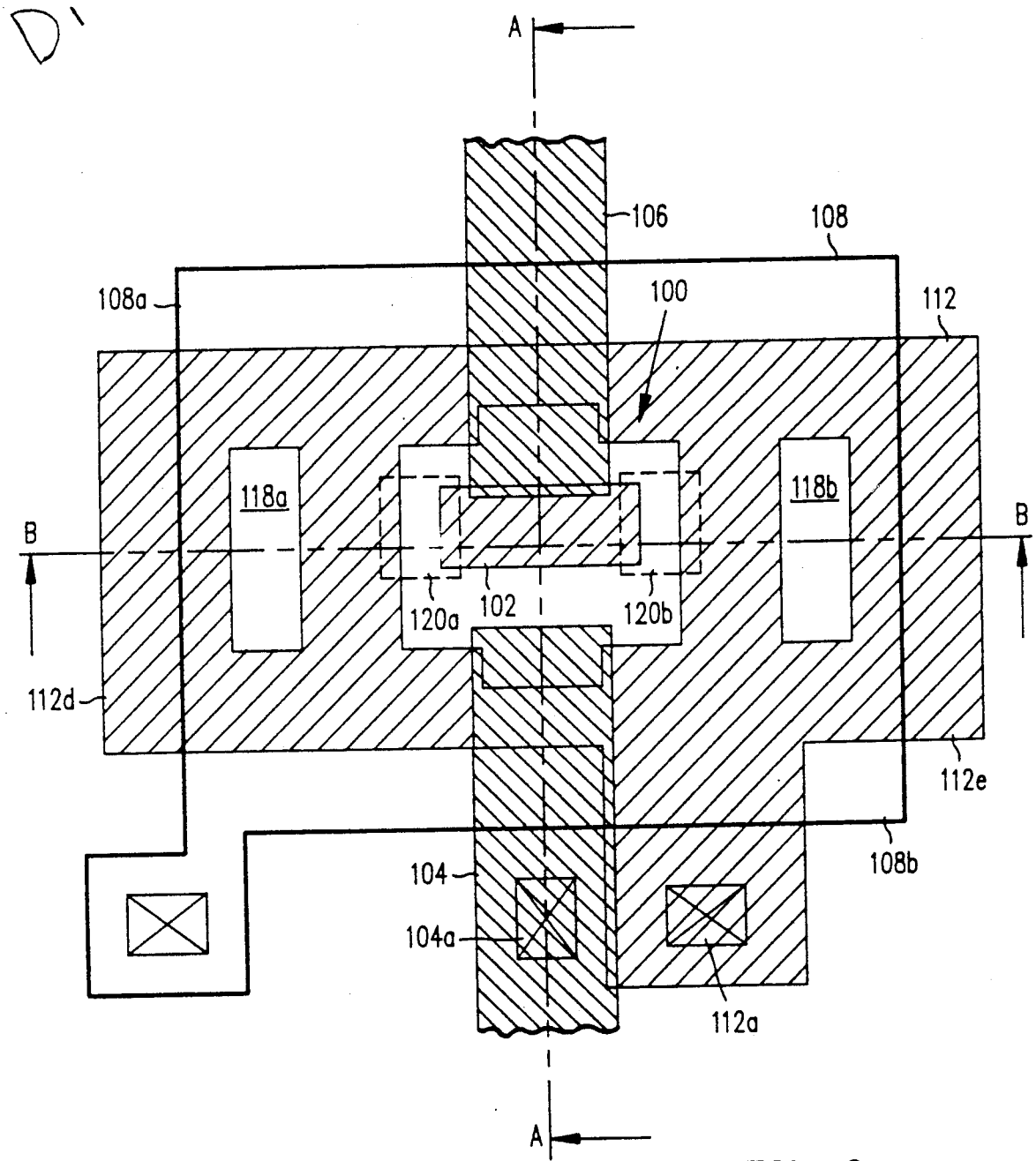
FIG. 2 illustrates in plan view an EPROM cell transistor constructed in accordance with one embodiment of my invention.

FIGS. 2, 3a and 3b illustrate an EPROM constructed in accordance with one embodiment of my invention. Referring to FIGS. 2, 3a and 3b, transistor 100 includes a floating gate 102, a source 104, a drain 106 and a control gate 108. Of importance, control gate 108 is formed not only over floating gate 102, but also over the area of semiconductor substrate 110 surrounding floating gate 102. Thus, in order for light to reach floating gate 102, it must pass underneath control gate 108 and reflect a large number of times off of substrate 110 and control gate 108 before reaching floating gate 102. Because of this, light is almost completely attenuated by the time it reaches floating gate 102 and, therefore, cannot erase floating gate 102.

Of importance, silicon dioxide layer 113 formed underneath control gate 108 is typically between 150 and 500 angstroms thick. By making silicon dioxide layer 113 thin, the number of times light must reflect off of control gate 108 and underlying semiconductor substrate 110 before reaching floating gate 102 must be large, thereby ensuring that the light is attenuated before reaching floating gate 102. By minimizing the thickness of silicon dioxide layer 113, the ability of the structure of FIGS. 2, 3a and 3b to block light is enhanced. As mentioned above, in the Folmsbee structure, the oxide between metal cover 1 and the underlying semiconductor substrate was 1.85 microns thick. By using control gate 108 as the light-blocking structure, I am able to make use of the fact that the oxide layer between the control gate and the underlying semiconductor structure is usually much thinner than the oxide between the metallization interconnects and the underlying semiconductor structure in a typical EPROM process. Thus, I make use of the fact that the silicon dioxide 113 underneath control gate 108 is extremely thin to enhance the light-blocking capability of the structure.

In accordance with one novel feature of my invention, a polysilicon structure 112 (formed concurrently with floating gate 102) laterally surrounds transistor 100. A portion 112a of polysilicon structure 112 electrically contacts metallization (not shown), which is typically grounded. Polysilicon structure 112 serves two important functions. First, structure 112 serves as a field plate. Normally, when two transistors are placed near one another, a thick field oxide region is formed in the semiconductor substrate to separate the transistors and prevent a parasitic channel from forming between the two transistors. However, I use grounded polysilicon 112 to serve as a field plate instead of surrounding transistor 100 with thick field oxide. (Although FIG. 2 illustrates only a single transistor, as will be described in greater detail below, in other embodiments, other transistors are formed adjacent transistor 100 and it is necessary to prevent parasitic channels from forming between the various transistors formed under a common control gate.)

Although field plate 112 prevents the above-mentioned parasitic currents, the structure of the present invention does include field oxide regions 120a, 120b to prevent parasitic current between source 104 and drain 106. If field oxide 120a, 120b were not present, application of a high voltage to control gate 108 would cause an inversion region in the space separating field plate 112 from floating gate 102. This inversion region would conduct current regardless of the charge stored on floating gate 102. Field oxide regions 120a, 120b prevent formation of the inversion region. In one embodiment, the size of field oxide 120a, 120b is minimized to impede light from reaching floating gate 102.

One advantage of using field plate 112 is that if a thick field oxide were formed along the entire portion of transistor 100 under control gate 108 to separate two adjacent transistors, that thick field oxide would be transparent and light could easily pass through such a field oxide region. By forming field plate 112, it is not necessary to have a thick transparent structure laterally surrounding transistor 100.

Figure 1:
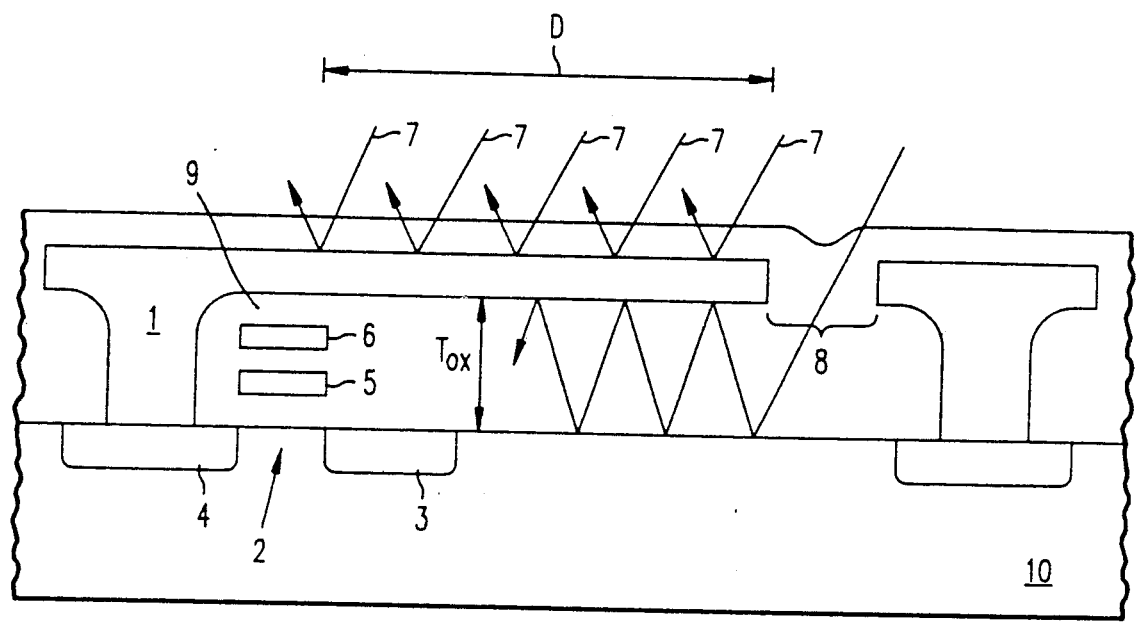
FIG. 1 illustrates a structure for preventing light from reaching a floating gate constructed in accordance with the prior art.
Figure 4:
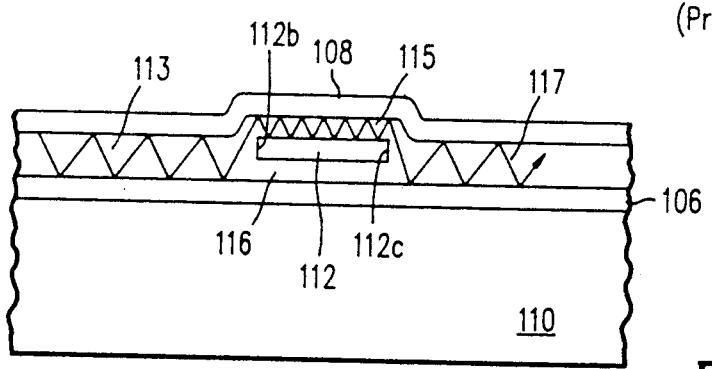
FIG. 4 illustrates light reflecting off a portion of the structure of FIGS. 2 and 3.

Another advantage of field plate 112 is that oxide 116 between field plate 112 and the underlying semiconductor material is extremely thin (e.g. about 300Å). In order for light 117 to reach floating gate 102, light 117 must either pass under thin oxide 116 or reflect in an upward direction, pass over field plate 112, and then reflect in a downward direction (see FIG. 4). Of importance, only a small percentage of the light impacting the semiconductor substrate near control gate 108 would be able to follow this path. Thus, field plate 112 serves as an additional light-blocking structure to further ensure that ambient light will not erase floating gate 102.

Another advantage of the present invention is that the thickness of oxide 113 between control gate 108 and underlying substrate 110 is thicker adjacent wall 112b where control gate 108 is relatively far apart from substrate 110 than it is further away from wall 112b where control gate 108 is relatively closer to substrate 110. Oxide 113 between control gate 108 and substrate 110 serves as a wave guide, and as the width of the wave guide changes, a standing wave forms in the wave guide. Some of the light passing underneath control gate 108 is reflected back from the region of increased oxide thickness, and thus the increase in oxide thickness adjacent to wall 112b also enhances the light blocking capability of the structure. The discontinuity in the oxide thickness between oxide 113 and oxide 116 and the discontinuity in oxide thickness between oxide 113 and oxide 115 also causes light to be reflected back toward the periphery of control gate 108. The I discontinuities in oxide thickness adjacent wall 112c of field plate 112 similarly impedes light from reaching floating gate 102.

As can be seen in FIG. 2, portions 112d and 112e of field plate 112 extend outwardly beyond the periphery of control gate 108. If this were not done and a high voltage (e.g., 5 volts) were applied to control gate 108, a conductive channel would form extending underneath control gate 108 around the periphery of field plate 112, thereby connecting source 104 to drain 106 regardless of the charge stored on floating gate 102.

Field plate 112 includes holes 118a and 118b. Because of this, light entering underneath walls 108a, 108b of control gate 108 must pass holes 118a, 118b in order to reach floating gate 102. Holes 118a, 118b impede light because of the wave guide effect discussed above in relation to FIG. 4.

It is noted that transistor 100 incorporates a split gate structure. The advantages of split gate EPROMs are discussed, for example, in U.S. Pat. No. 4,409,723 issued to Eliyahou Harari, incorporated herein by reference. In one embodiment, drain region 106 is self-aligned with floating gate 102. This is done for reasons described in U.S. Pat. No. 4,639,893, issued to Boaz Eitan, incorporated herein by reference.

FIG. 2 shows the electrical contact 112a between field plate 112 and contact metallization is laterally displaced from the contact 104a between source 104 and contact metallization. However, these electrical contacts can be formed adjacent one another, and can be defined by a common opening in the lithographic mask used to form the transistor. The common opening extends over both field plate 112 and source 104.

Figure 5:
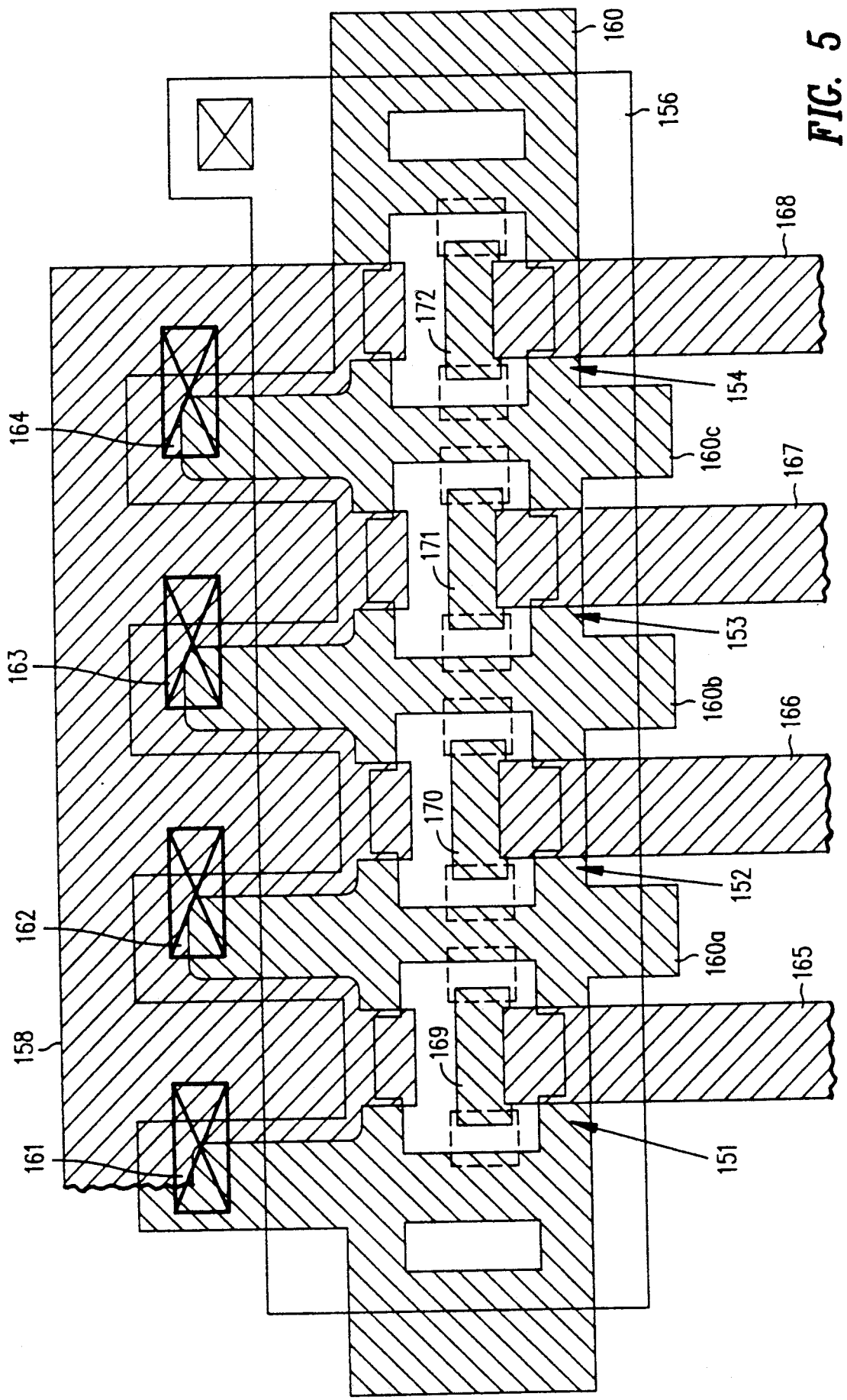
FIG. 5 illustrates in plan view a plurality of EPROM cell transistors constructed in accordance with another embodiment of my invention.

As mentioned above, in one embodiment, a plurality of transistors are formed underneath a common control gate. FIG. 5 illustrates an embodiment of my invention in which four transistors 151 to 154 are formed underneath a common control gate 156. Transistors 151 to 154 are coupled to a common source region 158 which is typically grounded. A polysilicon field plate 160 is electrically connected to ground via contacts 161 to 164. Contacts 161 to 164 extend past the edge of field plate 160 and are used to ground common source 158. Transistors 151 to 154 also include individual drains 165 to 168 and floating gates 169 to 172, respectively. The portions of drains 165 to 168 underneath control gate 156 are separated by portions 160a to 160c of field plate 160 to prevent parasitic channels from forming therebetween.

The structure of FIG. 5 operates in the same manner as that described above in relation to FIGS. 2 through 4, except that by providing a plurality of transistors under a common light-blocking control gate, the plurality of transistors can be formed on a smaller surface area than would be possible if the plurality of transistors were formed using separate light-blocking control gates.

The structure described in FIGS. 2 through 5 can be constructed using a process such as that described in above incorporated U.S. Pat. Application Ser. No. 06/902,236, e.g. at pages 10-12. In that process, the source and drain regions are formed after the first polysilicon layer. Thus, floating gate 102 and polysilicon structure 112 would serve as a mask during formation of source and drain regions 104 and 106, respectively (FIGS. 2, 3a and 3b). Drain region 106 is extended underneath polysilicon 112 by a diffusion process following the implantation step used to form drain 106. Similarly, source region 104 is diffused underneath polysilicon 112 to reach the transistor.

Figure 7:
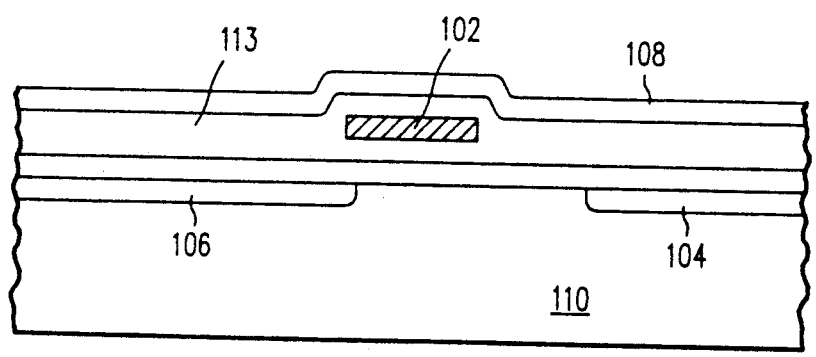
FIG. 7 illustrates in cross-section the EPROM cell transistor of FIG. 6 along lines AA.
Figure 6:
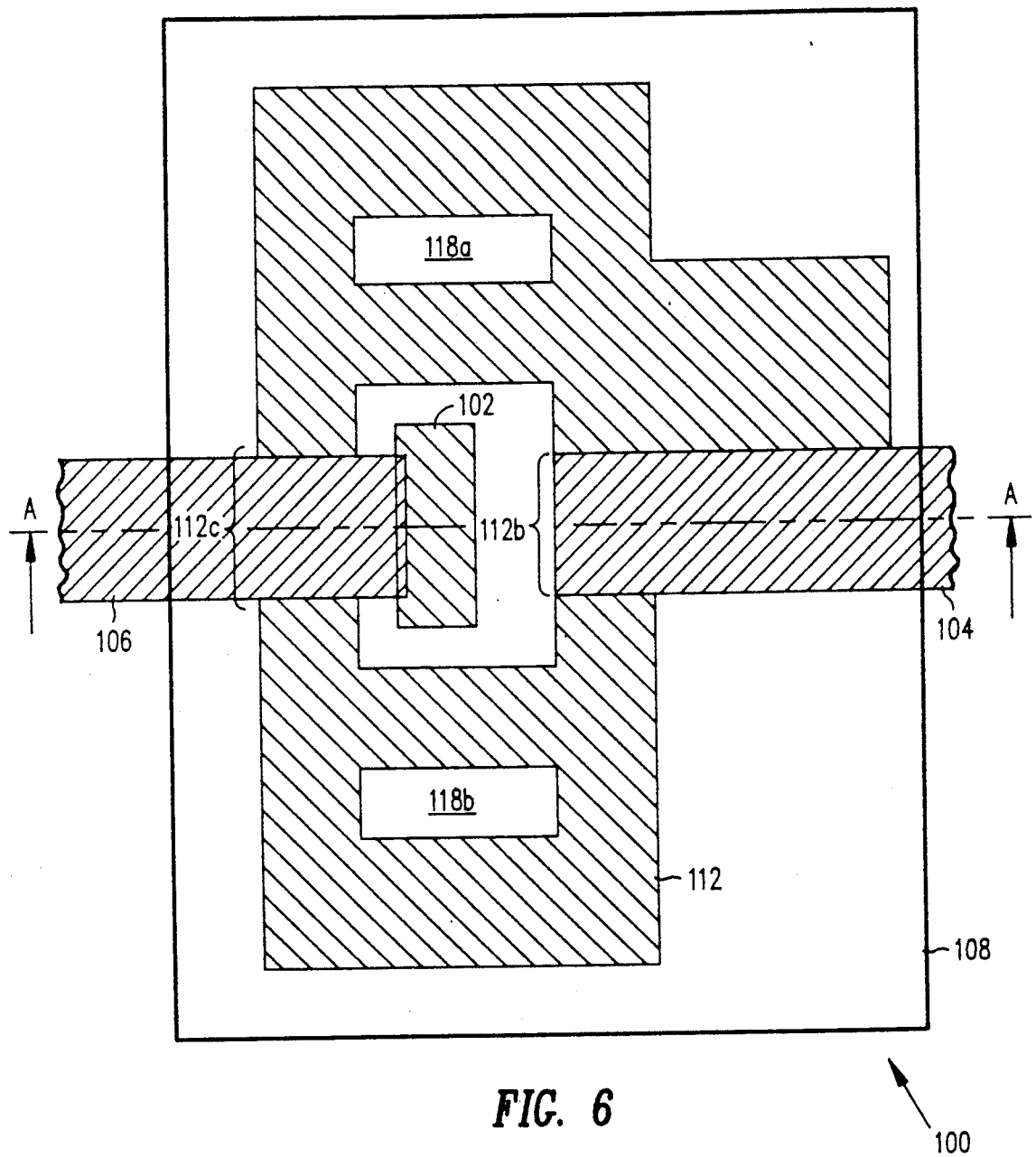
FIG. 6 illustrates in plan view an EPROM cell transistor constructed in accordance with another embodiment of my invention.

FIG. 6 illustrates another embodiment of my invention in which polysilicon 112 does not completely laterally surround the transistor but rather leaves openings 112b and 112c so as to facilitate extending source region 104 and drain region 106 towards floating gate 102. In this embodiment, polysilicon 112 is two discontiguous structures which are electrically grounded. FIG. 7 shows a cross section along line AA of FIG. 6. Polysilicon 112 does not appear in this cross section because the cross section is through the opening in polysilicon 112.

While the invention has been described with regard to a specific embodiment, those skilled in the art will recognize that changes can be made in form and detail without departing from the spirit and scope of the invention. Accordingly, all such changes come within the present invention.

I claim:

1. Transistor comprising:
   a source formed within a region of semiconductor material;
   a drain formed within said region of semiconductor material and spaced apart from said source, a channel region extending between said source and said drain;
   a first insulating layer overlying at least said channel region;
   a floating gate formed over at least a portion of said channel region and overlying said first insulating layer;
   a second insulating layer overlying said floating gate;
   a control gate overlying said second insulating layer and extending over said floating gate and the portion of said region of semiconductor material surrounding said floating gate, and being electrically insulated from said region of semiconductor material; and
   an opaque structure laterally surrounding said floating gate transistor and extending underneath said control gate and spaced apart from said floating gate and said control gate.

2. Transistor of claim 1 wherein said opaque structure is electrically conductive, formed from the same layer of material as said floating gate, and electrically insulated from said control gate.

3. Transistor of claim 2 wherein sad opaque structure serves as a field plate.

4. Transistor of claim 1 wherein a plurality of transistors are formed underneath said control gate, said opaque structure laterally surrounding each of said transistors within said plurality.

5. Transistor of claim 1 wherein said floating gate has a first side and a second opposing side, and further comprising a first field oxide region extending between said first side of said floating gate and said opaque structure and a second field oxide region formed between said second side of said floating gate and said opaque structure, said first and second field oxide regions preventing parasitic current from flowing between said source and said drain independently of the charge on said floating gate.

6. Transistor of claim 1 wherein said control gate includes a first wall and an opposing second wall and said opaque structure includes a first portion extending outwardly past said first wall of said control gate and a second portion extending outwardly past said second wall of said control gate, a first hole being formed in said opaque structure adjacent to said first wall and a second hole being formed in said opaque structure adjacent to said second wall, said first and second holes defining a wave guide structure and thereby impeding light from reaching said floating gate.

7. Transistor of claim 6 wherein said opaque structure comprises an outer wall and an inner wall, said inner wall facing said floating gate, said opaque structure being separated from the region of semiconductor material by said first insulating layer, said opaque structure being separated from said control gate by said second insulating layer, the control gate extending over a portion of the region of semiconductor material and being separated from the region of semiconductor material by said first insulating layer, the portion of the first insulating layer adjacent the outer wall of the opaque structure being thicker than the portion of said first insulating layer located away from said opaque structure, the increase in insulation thickness between the portion of the first insulating layer adjacent the said opaque structure and the thickness of said first insulating layer located away from said opaque structure causing at least some light to be reflected towards the periphery of said control gate, thereby enhancing the ability of said opaque structure to prevent light from impinging on said floating gate.

8. Transistor of claim 1 wherein said source and drain extend inwardly underneath said opaque structure toward said floating gate.

9. Transistor of claim 8 whrein said source and drain are extended underneath said opaque structure by side diffusion.

10. Transistor of claim 1, wherein said control gate comprises polycrystalline silicon, and wherein said control gate is not overlaid by an opaque metal cover.

* * * * *